United States Patent [19]

Summers

[11] Patent Number: 5,070,254

[45] Date of Patent: Dec. 3, 1991

[54] PULSE GENERATORS WITH CONSTANT MARK/SPACE RATIO AND SMALL PHASE MODULATION JITTER

[75] Inventor: Christopher P. Summers, London, England

[73] Assignee: U.S. Philips Corporation, New York, N.Y.

[21] Appl. No.: 494,202

[22] Filed: Mar. 14, 1990

[30] Foreign Application Priority Data

Mar. 17, 1989 [GB] United Kingdom ............... 8906227

[51] Int. Cl.$^5$ .................... H03K 21/02; H03K 7/00
[52] U.S. Cl. ................................. 307/261; 307/265; 328/13; 328/14
[58] Field of Search ............... 307/261, 265; 328/59, 328/67, 13, 14, 22; 341/144

[56] References Cited

U.S. PATENT DOCUMENTS

| | | | |
|---|---|---|---|
| 3,772,681 | 11/1973 | Skingle | 328/14 |
| 4,003,003 | 1/1977 | Haeberlin | 328/14 |
| 4,740,995 | 4/1988 | Schevin et al. | 328/14 |
| 4,758,971 | 7/1988 | Wright . | |
| 4,823,090 | 4/1989 | Coleman et al. | 328/14 |
| 4,901,265 | 2/1990 | Kerr et al. | 328/14 |

OTHER PUBLICATIONS

A. Bateman et al., "Digital Signal Processing Design", Computer Science Press, published by Pitman in Great Britain in 1988, pp. 288-291.

Primary Examiner—Stanley D. Miller
Assistant Examiner—Toan Tran
Attorney, Agent, or Firm—William Squire

[57] ABSTRACT

A digital oscillator produces a succession of numbers from which a periodic analogue waveform is produced. These numbers represent a triangular waveform (or a sine waveform). Their direct conversion into analogue form by a digital-to-analogue converter, followed by integration by an integrator produces a distorted analogue waveform SW which when limited by a limiter produces an output pulse waveform with an inaccurate mark/space ratio. A subtraction circuit 2 subtracts each number produced by the digital pulse generator from the previous number, to produce a series of new numbers which represent a pre-distorted waveform. When these new numbers are converted into analogue form, the integration of the resulting waveform by the integrator produces an analogue waveform with clearly defined zero crossings. The output pulse waveform is thereby given a relatively constant mark/space ratio. Furthermore, when the pulse generator is driven by a clock whose frequency is several times greater than the frequency of the output pulse waveform, the latter suffers only small phase modulation (jitter).

8 Claims, 2 Drawing Sheets

Fig. 5a
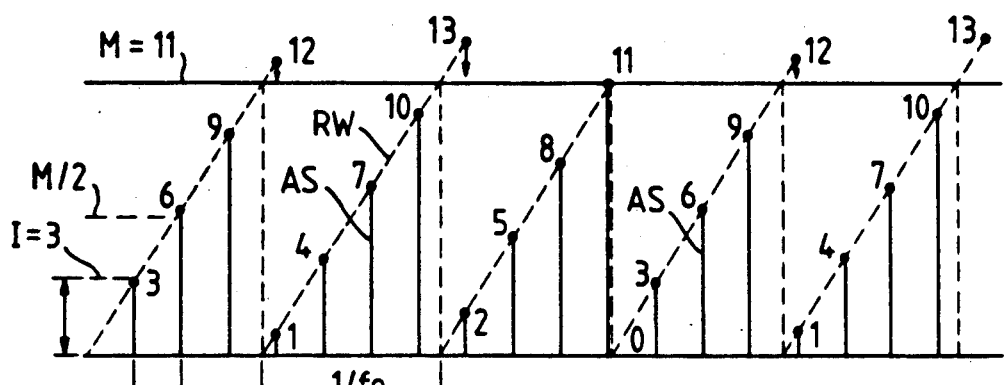
Fig. 5b
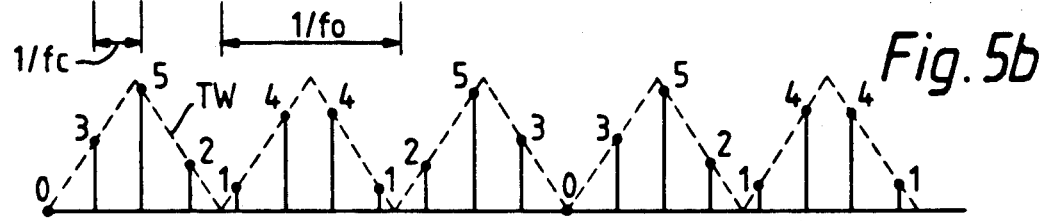
Fig. 5c
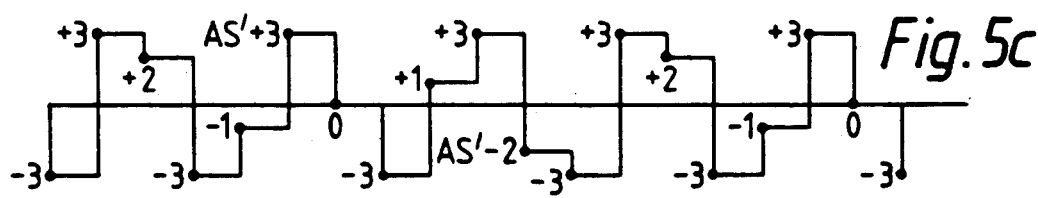
Fig. 5d
Fig. 5e
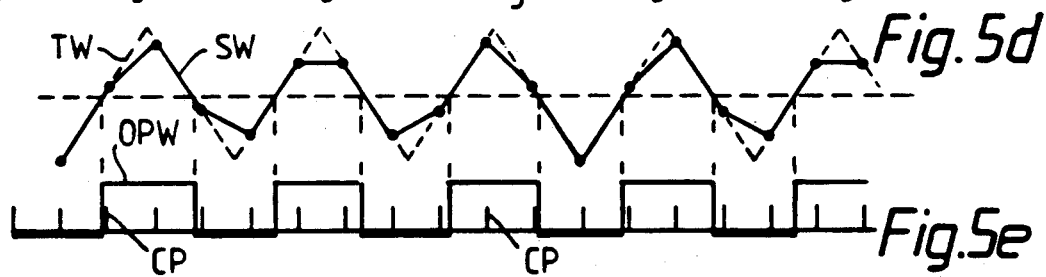
Fig. 5f
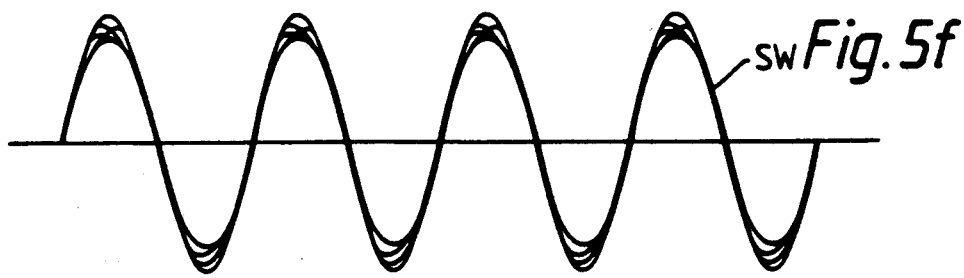

PULSE GENERATORS WITH CONSTANT MARK/SPACE RATIO AND SMALL PHASE MODULATION JITTER

The invention relates to pulse generators comprising, digital oscillator means for producing a succession of numbers which represent amplitude samples for a periodic analogue waveform, digital-to-analogue converter means for converting these numbers into a synthesised waveform, reconstruction filter means for extracting the analogue waveform from the synthesised waveform, and output means for producing an output pulse waveform from the extracted analogue waveform.

Where, as is commonly the case, the output pulse waveform from a pulse generator of the type set forth above is required to have an equal mark/space ratio, and also small phase modulation (jitter), this can be accomplished by producing the extracted analogue waveform as a sine waveform which is then amplitude limited by the output means to produce the output pulse waveform.

However, the accuracy with which the sine waveform can be produced is determined by the efficiency of operation of the "means" which comprise the pulse generator. For instance, the efficiency of the digital oscillator means can be restricted by the number of digital samples that it can produce per cycle of the intended analogue waveform and the combined efficiency of the digital-to-analogue converter means and the reconstruction filter means can be restricted by the accuracy with which digital samples from the oscillator means are converted into discrete amplitude values which persist for the duration between successive digital samples.

It is an object of the present invention to provide an improved pulse generator of the type set forth above.

According to the present invention a pulse generator of the type set forth above is characterised by including subtraction means to which each number produced by the digital oscillator means is applied and which is operable to subtract from this number at least part of the previous number in the succession to produce a succession of difference numbers which are applied to the digital-to-analogue converter means, instead of the original numbers, for conversion into a modified synthesised waveform, the pulse generator being further characterised in that the reconstruction filter means thereof comprise an integrator for extracting the analogue waveform from the modified synthesised waveform.

Preferably, the entire previous number each time is subtracted from the current number to produce the difference number.

The effect of the subtraction means in a pulse generator according to the invention is to provide a succession of new numbers which represent amplitude samples for an analogue waveform whose slope or differential is altered with respect to that of the original analogue waveform. As a consequence, it has been found that the synthesised waveform now produced by the digital-to-analogue converter means will be correspondingly differentially adjusted such that the subsequent integration thereof by the integrator will result in a more accurate extracted analogue waveform. As will be described, the extracted analogue waveform which can now be obtained is suitable for the production therefrom by a limiter of an output pulse waveform having a mark/space ratio which approximates to 1:1 for practical purposes, and has small phase modulation (jitter).

The invention has a particular but non-exclusive application to pulse generators of the type set forth above in which the digital oscillator means is a so-called discrete time oscillator. Discrete time oscillators are known in the art. For example, the book "Digital Signal Processing Design", by A. Bateman et al, published by Pitman in Great Britain in 1988, describes such an oscillator at pages 288 to 291.

A discrete time oscillator provides a succession of output numbers which represent amplitude samples for a ramp or sawtooth waveform. These output numbers are obtained by using an increment number I to increase a modulo-M accumulator at a clock frequency fc. After each step the number attained by the accumulator is the current output number from the oscillator. The ratio I/M equals the ratio of the ramp waveform frequency fo to the clock frequency fc, so that $fo = I/M \times fc$. For a given ramp waveform frequency fo, the increment number I may be fixed, or it may be continually varied, for instance when the pulse generator output pulse waveform is stabilised in a phase-locked loop.

In the prior art article referred to above, the output numbers from the oscillator are converted into other numbers which represent amplitude samples for a triangular waveform.

In the design of integrated circuits which comprise both digital and analogue portions, it may be beneficial, for instance in the case of CMOS integrated circuits, to restrict the analogue portion to a minimum.

A preferred embodiment of a pulse generator according to the present invention includes a discrete time oscillator, together with conversion means for converting the output numbers from the oscillator into different numbers which represent amplitude samples for a triangular waveform, the different numbers being applied to the subtraction means instead of the output numbers. In this processing, as will be described, relatively few output numbers from the discrete time oscillator are required in order to extract from the synthesised waveform an analogue waveform from which can be produced an output pulse waveform having a mark/space ratio which is approximately 1:1 for practical purposes, and has small phase modulation (jitter).

Also, in a preferred embodiment of a pulse generator according to the present invention, comprising the combination of the integrator and the limiter, a dc feedback loop is connected between the output of the limiter and the input of the integrator. This feedback loop serves to keep the dc output from the integrator within a correct dynamic range which may otherwise be exceeded due to errors produced in the digital-to-analogue converter means.

In order that the invention may be more fully understood reference will now be made by way of example to the accompanying drawings, of which:

FIGS. 5a–5e show idealised explanatory waveforms.

Figure 1:
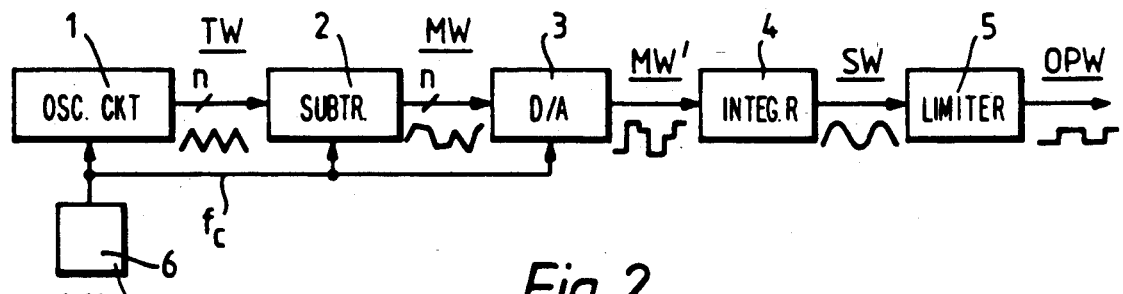
FIG. 1 is a block diagram representing a pulse generator according to the invention.

Referring to the drawings, the pulse generator represented by the block diagram in FIG. 1 comprises a digital oscillator circuit 1, a subtraction circuit 2, a digital-to-analogue converter circuit 3, an integrator circuit 4, a limiter circuit 5 and a clock pulse source 6 which produces clock pulses of frequency fc. The digital oscillator circuit 1 is operable at the clock pulse rate (fc) to produce a succession of numbers of n bits which represent amplitude samples for a periodic analogue waveform. Each number is subtracted from the previous number by the subtraction circuit 2 and the new numbers, also of n bits, thus obtained are applied to the converter circuit 3 which is operable to convert these new numbers into a synthesised waveform. These circuits 2 and 3 also operate at the clock pulse rate (fc) which is set by the source 6. The integrator circuit 4 functions as a reconstruction filter to extract the analogue waveform from the synthesised waveform. Finally, the limiter circuit 5 performs squaring of the analogue waveform to produce output pulses of frequency fo for the pulse generator.

The circuit elements shown in FIGS. 2 to 5 provide for one particularly advantageous implementation of a pulse generator according to the invention which requires only a relatively few digital numbers per cycle of the periodic analogue waveform to produce an output pulse waveform having a mark/space ratio which is sufficiently accurate for practical purposes, and has small phase modulation (jitter). Also, with this implementation, the frequency of the periodic analogue waveform and therefore that of the output pulse waveform also, can be readily altered. This latter feature facilitates the production of a clock pulse train, as constituted by the output pulse waveform, of a required frequency from an available clock pulse source of a higher but fixed frequency.

Figure 2:
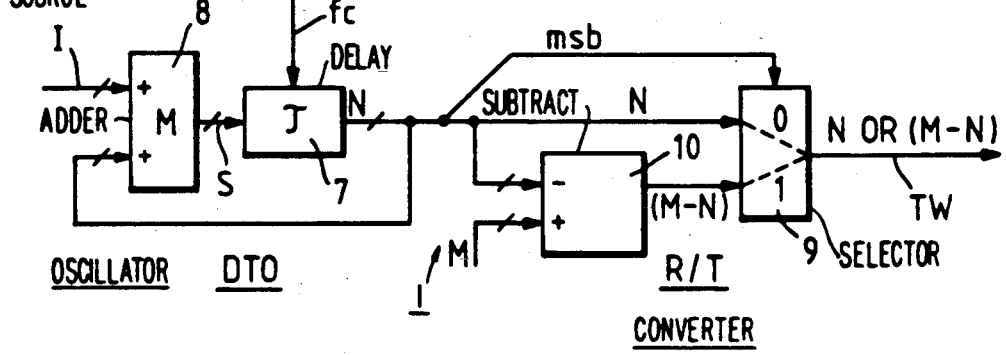
FIGS. 2 to 4 are block diagrams of certain circuit elements for the pulse generator represented by the block diagram in FIG. 1.

The circuit element shown in FIG. 2 is for the digital oscillator circuit 1 (FIG. 1) and comprises a discrete time oscillator DTO and a ramp-to-triangle waveform converter R/T. The oscillator DTO consists of a modulo-M delay element 7 which is operated by the clock pulses at the rate fc, and an adder 8 the output of which is connected to the input of the delay element 7. A constant multi-bit increment number I is applied at one input of the adder 8 and a multi-bit number N of n+1 bits at the output of the delay element 7 is applied at the other input of the adder 8. At each clock period the multi-bit sum number S at the output of the adder 8 is increased by the number I until overflow occurs at a number value M. The first value of the sum number S after overflow is the last value plus I modulo M. The numbers N at the output of the delay element 7 represent amplitude samples AS for a periodic ramp waveform RW as shown in FIG. 5a. The line M represents the overflow number value M at which the ramp waveform RW each time restores to zero amplitude when this overflow value is exceeded. Assuming a range of binary sample values 0, 1, 2 . . . 13, an overflow value of M=11, and an increment number I=3, then the actual samples AS have the values indicated within this range.

These numbers N produce a recurring sequence of three ramps in each of which the actual number values are different because of the modulo-M effect of the delay element 7 and the adder 8.

The resulting ramp waveform RW has a period 1/fo for which the frequency fo=I/M×fc. The frequency fo is the frequency of the output pulse waveform of the pulse generator.

Because a ramp waveform synthesised from the numbers N would have a high harmonic content which would limit its usefulness in providing a reliable mark/space ratio, these numbers are converted by the converter R/T into different numbers which represent amplitude samples for a triangular waveform. In the converter R/T, the most significant bit msb of the number N is applied to the control input of a two-way selector 9. One input of the selector 9 has the number N applied to it and a second input thereof has a difference number (M−N) applied to it. This difference number (M−N) is produced by a subtract circuit 10 which has the numbers M and N applied at its two inputs. When the bit msb=0, the numbers N are produced at the output of the selector 9. When the bit msb=1, the numbers (M−N) are produced at the output of the selector 9. In other words, the outputted number is N when $N<M/2$ and is (M−N) when $N \geq M/2$. This can be represented by the state of the most significant bit if $M=2^{n-1}$. If M does not have such a value then the control input can receive the output of a comparator which compares the value of N with M/2. FIG. 5b shows the resulting triangular waveform TW which these numbers N and (M−N) at the output of the selector 9 represent. The original numbers N which define the leading edge of the waveform TW and are of smaller value than the mean level M/2 are unchanged. The new numbers (M−N) define the trailing edge of the waveform TW.

Figure 3:
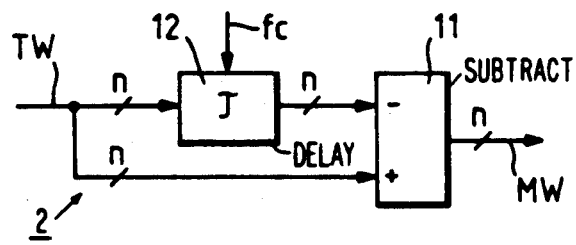

The circuit element shown in FIG. 3 is for the subtraction circuit 2 (FIG. 1) and comprises a subtract element 11 and a delay element 12. The delay element 12 is clocked at the clock pulse rate fc. One input of the subtract element 11 has the numbers representing the triangular waveform TW applied to it and the other input has applied to it the previous number as delayed by the delay element 12. The numbers produced at the output of the subtraction circuit represent positive and negative amplitude samples AS', as shown in FIG. 5c, for a pre-distorted waveform (MW-FIG. 1). This pre-distorted waveform is better suited than the triangular waveform TW for conversion into the extracted analogue waveform from which the output pulse waveform is to be produced. The pre-distortion partially compensates for the distortion produced by the reconstruction filter.

Figure 4:
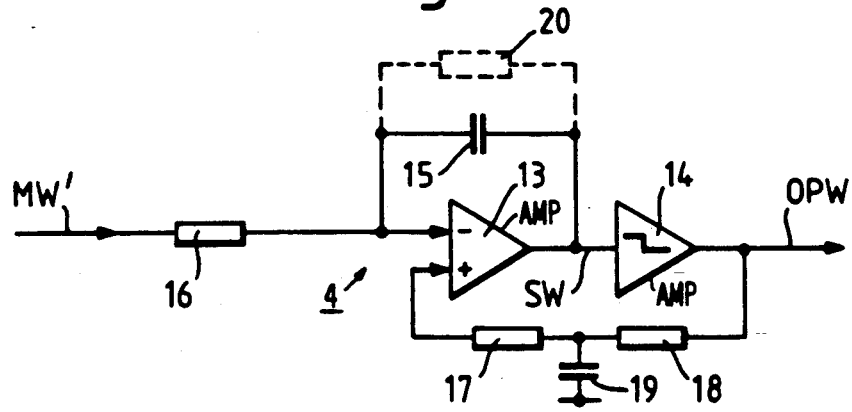

The circuit element shown in FIG. 4 is for the integrator circuit 4 and limiter circuit 5 of FIG. 1 and comprises an compartor amplifier 13 and a limiter amplifier 14 and an integrating capacitor 15. The input of this circuit element has applied to it the synthesised waveform MW' (FIG. 5c) as generated by the digital-to-analogue converter circuit 3 (FIG. 1) from the number samples representing the pre-distorted waveform MW and produced at the output of the subtraction circuit 2. The synthesised waveform MW' is fed via a resistance 16 to one input of the comparator amplifier 13 whose other input has fed to it via a feedback path comprising resistances 17, 18 and a capacitance 19, an output pulse waveform OPW from the output of the limiter amplifier 14. The resulting output waveform SW from the comparator amplifier 13 (integrator) is represented by the waveform SW in FIG. 5(d). FIG. 5(d) also shows the triangular waveform TW delayed to show the similarity between the waveforms SW and TW. The charge present on the capacitance 19 is continually adjusted at a slow rate by the differential action of the amplifier 13 so as to maintain a controlled average mark/space ratio of the output pulse waveform OPW. A high value resistor 20, shown in dashed line, may be connected across the integrating capacitor 15 to correct for any instability in the circuit.

The pulse generator according to the invention thus provides an output pulse waveform of a predetermined frequency from an available higher clock frequency. This enables the pulse generator to be fabricated on an integrated circuit without the need to provide a dedicated external crystal or other resonating element of the appropriate frequency for it. It has been found in the performance of the invention that the ratio of the clock frequency to the output pulse frequency should not be less than approximately 4:1. This ensures that there are a minimum of two sample numbers to define each slope of the triangular waveform. Below this minimum, the slopes become indeterminate and, as a result, the zero crossings of the waveform SW at the output of the integrator 13 are positioned insufficiently accurately for the output pulse waveform to have a reliable 1:1 mark/space ratio and also small phase modulation (jitter).

A known disadvantage of a discrete time oscillator is the jitter effect which occurs in the output pulse waveform. This jitter effect is illustrated in FIG. 5(e) from which it can be seen that the output pulse waveform OPW will in theory vary progressively in phase relative to the clock pulses CP by up to one complete clock pulse period. Such a jitter effect can be undesirable, particularly for an envisaged application of the pulse generator in which the output pulse waveform is to provide the clock pulses for controlling the timing for a visual text display on a television screen.

A pulse generator according to the invention significantly reduces this jitter effect as a consequence of the operations of the subtraction circuit and the integrator. The resulting analogue waveform SW extracted by the integrator has corrupted positive and negative peaks as illustrated in FIG. 5(f), but its slopes are accurately defined with relatively little remaining jitter, so that when this waveform is limited, the resulting output pulse waveform has a 1:1 mark/space ratio of the required accuracy, and also small phase modulation (jitter).

Various modifications are possible within the scope of the invention. For instance, the digital oscillator means may be adapted to produce a succession of numbers which represent amplitude samples for a sine waveform. This can be achieved by using a read only memory as a look-up table to convert output numbers which represent amplitude samples for a ramp waveform as produced by a discrete time oscillator into different numbers which represent amplitude samples for a sine waveform. Also, the integrator can be implemented as a low pass filter.

From reading the present disclosure, further modifications will be apparent to persons skilled in the art. Such modifications may involve other features which are already known per se and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A pulse generator comprising, digital oscillator means for producing a succession of numbers which represent amplitude samples for a periodic analogue waveform, digital-to-analogue converter means for converting these numbers into a synthesised waveform, reconstruction filter means for extracting an analogue waveform from the synthesised waveform, and output means for producing an output pulse waveform from the extracted analogue waveform, which pulse generator includes subtraction means to which each number produced by the digital oscillator means is applied and which is operable to subtract from this number at least part of the previous number in said succession to produce a succession of difference numbers which are applied to the digital-to-analogue converter means, instead of the original numbers, for conversion into a modified synthesised waveform, said reconstruction filter means comprising an integrator for extracting the analogue waveform from the modified synthesised waveform.

2. A pulse generator as claimed in claim 1 said subtraction means subtracts the entire previous number each time from the current number to produce the difference number.

3. A pulse generator as claimed in claim 1 wherein said digital oscillator includes a discrete time oscillator, together with conversion means for converting the output numbers from the oscillator into different numbers which represent amplitude samples for a triangular waveform, said different numbers being applied to the subtraction means instead of said output numbers.

4. A pulse generator as claimed in claim 3 wherein said output means comprises a limiter.

5. A pulse generator as claimed in claim 4 including a d.c. feedback loop between the output of the limiter and the input of the integrator.

6. A pulse generator as claimed in claim 2 wherein said output means comprises a limiter.

7. A pulse generator as claimed in claim 1 wherein said output means comprises a limiter.

8. A pulse generator as claimed in claim 2 wherein said digital oscillator includes discrete time oscillator, together with conversion means for converting the output numbers from the oscillator into different numbers which represent amplitude samples for a triangular waveform, said different numbers being applied to the subtraction means instead of said output numbers.

* * * * *